(12) United States Patent
Sung

(10) Patent No.: US 10,739,407 B2
(45) Date of Patent: Aug. 11, 2020

(54) SYSTEM AND METHOD FOR ESTIMATING STATE OF HEALTH USING BATTERY MODEL PARAMETER

(71) Applicants: Hyundai Motor Company, Seoul (KR); Kia Motors Corporation, Seoul (KR)

(72) Inventor: Woo Suk Sung, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/387,229

(22) Filed: Apr. 17, 2019

(65) Prior Publication Data

US 2019/0250215 A1    Aug. 15, 2019

Related U.S. Application Data

(62) Division of application No. 14/636,847, filed on Mar. 3, 2015, now Pat. No. 10,310,019.

(30) Foreign Application Priority Data

Nov. 6, 2014 (KR) .................. 10-2014-0153938

(51) Int. Cl.
*G01R 31/367* (2019.01)
*G01R 31/382* (2019.01)
(Continued)

(52) U.S. Cl.
CPC ......... *G01R 31/367* (2019.01); *G01R 31/382* (2019.01); *G01R 31/392* (2019.01);
(Continued)

(58) Field of Classification Search
CPC .............. G01R 31/367; G01R 31/3682; G01R 31/392; G01R 31/382; H01M 10/48; H01M 10/052; H01M 10/0566
See application file for complete search history.

(56) References Cited

U.S. PATENT DOCUMENTS

2009/0276172 A1    11/2009 Nishi
2011/0199055 A1*   8/2011 Burchardt ............. H01M 10/44
                                                        320/148
(Continued)

FOREIGN PATENT DOCUMENTS

JP    2008-058278 A    3/2008
JP    2008-059910 A    3/2008
(Continued)

*Primary Examiner* — David Lam
(74) *Attorney, Agent, or Firm* — Mintz Levin Cohn Ferris Glovsky and Popeo, P.C.; Peter F. Corless

(57) ABSTRACT

A method and system for estimating a state of health using battery model parameters are provided. The system includes a battery model parameter extractor that is configured to extract liquid-phase diffusivity of Li-ion parameters and a storage unit that is configured to store a mapping table in which states of health (SOH) for each liquid-phase diffusivity of Li-ion parameter are mapped. In addition, a SOH estimator is configured to use the mapping table to estimate the SOH that corresponds to a liquid-phase diffusivity of Li-ion extracted from the battery model parameter extractor.

8 Claims, 9 Drawing Sheets

(51) Int. Cl.
  *G01R 31/392*   (2019.01)
  *H01M 10/48*    (2006.01)
  *H01M 10/052*   (2010.01)
  *H01M 10/0566*  (2010.01)

(52) U.S. Cl.
  CPC .......... *H01M 10/48* (2013.01); *H01M 10/052* (2013.01); *H01M 10/0566* (2013.01)

(56) References Cited

U.S. PATENT DOCUMENTS

| | | |
|---|---|---|
| 2012/0109443 A1 | 5/2012 | Takahashi et al. |
| 2016/0011274 A1 | 1/2016 | Morita et al. |

FOREIGN PATENT DOCUMENTS

| | | |
|---|---|---|
| JP | 2009-044862 A | 2/2009 |
| JP | 2011-015520 A | 1/2011 |
| JP | 2013-247726 | 12/2013 |
| JP | 2013-254710 A | 12/2013 |
| JP | 2014-146427 A | 8/2014 |
| KR | 2009-0057300 | 6/2009 |
| KR | 2013-0064308 | 6/2013 |
| KR | 2013-0073802 | 7/2013 |
| KR | 2014-0082750 | 7/2014 |
| WO | 2011-125213 A1 | 10/2011 |

\* cited by examiner

| Liquid-phase diffusivity of Li-ion [m²s⁻¹] | Rated capacity | Capacity fade | SOH (State Of Health) |
|---|---|---|---|
| 1.238×10⁻¹⁰ | 28.212 | 0 | 100 |
| 8.837×10⁻¹¹ | 27.464 | 2.7 | 97.3 |
| 6.925×10⁻¹¹ | 26.443 | 6.3 | 93.7 |
| 5.925×10⁻¹¹ | 25.316 | 10.3 | 89.7 |
| 5.352×10⁻¹¹ | 24.295 | 13.9 | 86.1 |
| 5.067×10⁻¹¹ | 23.799 | 15.6 | 84.4 |

FIG.6

SYSTEM AND METHOD FOR ESTIMATING STATE OF HEALTH USING BATTERY MODEL PARAMETER

CROSS-REFERENCE TO RELATED APPLICATION

This application is a divisional of U.S. patent application Ser. No. 14/636,847 filed on Mar. 3, 2015 which is based on and claims the benefit of priority to Korean Patent Application No. 10-2014-0153938, filed on Nov. 6, 2014 in the Korean Intellectual Property Office, the disclosure of which is incorporated herein in its entirety by reference.

TECHNICAL FIELD

The present disclosure relates to a system and method for estimating a state of health (SOH) using battery model parameters, and more particularly, to a technology of estimating a state of health using a liquid-phase diffusivity of Li-ion parameter having high correlation with a deterioration of the battery among battery model parameters.

BACKGROUND

As the problem of environmental pollution increases, the competition among different technical fields to develop environmentally-friendly energy is increasing. In addition, the competition to develop alternative sources of energy due to a depletion of petroleum and natural resources, and the like has increased. Accordingly, the competition among vehicle manufacturers to develop next-generation vehicles is increasing. Among the next-generation vehicles, there are pure electric vehicles (EV) which use a battery as an energy source and an engine hybrid electric vehicle (HEV), a fuel cell hybrid electric vehicle, and the like, which use a battery as an energy buffer.

In the hybrid vehicle, a battery system is one of main parts that determines a quality of a vehicle. The battery system of the hybrid vehicle is an auxiliary energy source which assists an output of an engine and accumulates generated energy while the vehicle is driven. In particular, a control technology of the battery system is important which includes a power control, cooling, diagnosis, a state of charge (SOC) calculation, and the like.

Among those control technologies, the state of charge calculation is an important factor for driving strategy of a vehicle. In other words, in the hybrid vehicle, the state of charge is calculated to operate a battery to be charged when additional energy is generated and operate the vehicle to obtain a required output by discharging the battery when a substantially high output is required. Therefore, to reduce energy and maximize operation efficiency of the hybrid vehicle by accurately implementing the driving strategy of the hybrid vehicle, there is a need to more accurately calculate the state of charge.

When the state of charge calculation is inaccurate, the operation efficiency of the hybrid vehicle may be reduced and dangerous situations may occur. For example, when the actual state of charge is 80% but the calculated state of charge is 30%, a vehicle controller is configured to determine that the charging is required, and thus the battery may be overcharged or in the opposite case, the battery may be overdischarged. Ignition or explosion of the battery may occur due to the overcharging or the overdischarging, and thus dangerous situations may occur.

For the state of charge calculation, battery degradation, that is, a state of health is provided as a main input. The state of health is increasing degraded based on use environment or a use period of time than an early production of a battery, and thus an available capacity is reduced or resistance is increased. Generally, the state of health is degraded to about 20%. To prevent the reduction in energy and the risk by efficiently operating the hybrid vehicle, there is a need to more accurately estimate the state of health.

The existing method for estimating a state of health may vary, but may be divided into two methods. A first method is a method for directly applying a load having a predetermined frequency configuring hardware to the battery to measure impedance thereof and understand the state of health. A second method is a method for acquiring current and voltage pair data for a predetermined period to infer indirect impedance or a degraded capacity.

The first method for using hardware may have reduced efficiency due to errors, durability, costs, and the like of a method for configuring a circuit thereof and sensors. The second method may be difficult to implement the accurate inference or may have complex logic due to strong nonlinearity and disturbances from the method for acquiring the current and voltage pair data to the method for inferring the indirect impedance and the degraded state of charge.

Accordingly, a method for estimating a state of health by calculating charging capacity within a specific voltage section based on a current accumulation is developed, which may be applied at room temperature and during slow charging and may be vulnerable to accumulated errors of a current sensor during the current accumulation.

SUMMARY

The present provides a system for estimating a state of health using battery model parameters and a method thereof capable of estimating the state of health using a liquid-phase diffusivity of lithium ion (Li-ion) parameter having a high correlation with capacity fade of the battery among the battery model parameters.

According to an exemplary embodiment of the present disclosure, a system for estimating a state of health using battery model parameters may include a battery model parameter extractor configured to extract liquid-phase diffusivity of Li-ion parameters; a storage unit configured to store a mapping table in which states of health for each liquid-phase diffusivity of Li-ion parameter are mapped; and an state of health (SOH) estimator configured to use the mapping table to estimate the SOH that corresponds to liquid-phase diffusivity of Li-ion extracted from the battery model parameter extractor.

The liquid-phase diffusivity of Li-ion parameter may include liquid-phase diffusivity of Li-ion in a liquid electrolyte. The mapping table may include capacities and capacity fades of the battery mapped to each liquid-phase diffusivity of Li-ion parameter value. The SOH may be calculated by dividing current rated capacity of the battery by initial rated capacity of the battery. The battery model parameter extractor may be configured to collect voltage data during the charging and when the charging is completed, extract the liquid-phase diffusivity of Li-ion parameter using the voltage data.

According to another exemplary embodiment of the present disclosure, a method for estimating a state of health using battery model parameters may include: determining whether a battery begins to be charged; collecting data for parameter extraction when the battery begins to be charged;

extracting a liquid-phase diffusivity of Li-ion parameter using the data when the charging of the battery ends; and estimating the state of health using the liquid-phase diffusivity of Li-ion parameter.

The method may further include: prior to the determining whether a battery begins to be charged, generating and storing a mapping table in which SOHs for each liquid-phase diffusivity of Li-ion parameter value are mapped by calculating the SOHs for each liquid-phase diffusivity of Li-ion parameter based on an experiment. In the generating and storing of the mapping table, rated capacities of the battery for each liquid-phase diffusivity of Li-ion parameter may be calculated and the SOH may be calculated by dividing rated capacity of the battery by initial rated capacity of the battery and stored. The liquid-phase diffusivity of Li-ion parameter may include a liquid-phase diffusivity of Li-ion in a liquid electrolyte.

BRIEF DESCRIPTION OF THE DRAWINGS

The above and other objects, features and advantages of the present disclosure will be more apparent from the following detailed description taken in conjunction with the accompanying drawings.

FIG. 6 is an exemplary table in which a relationship between the liquid-phase diffusivity of Li-ion parameter according to the exemplary embodiment of the present disclosure and a state of health (SOH) is mapped.

DETAILED DESCRIPTION

Figure 1:
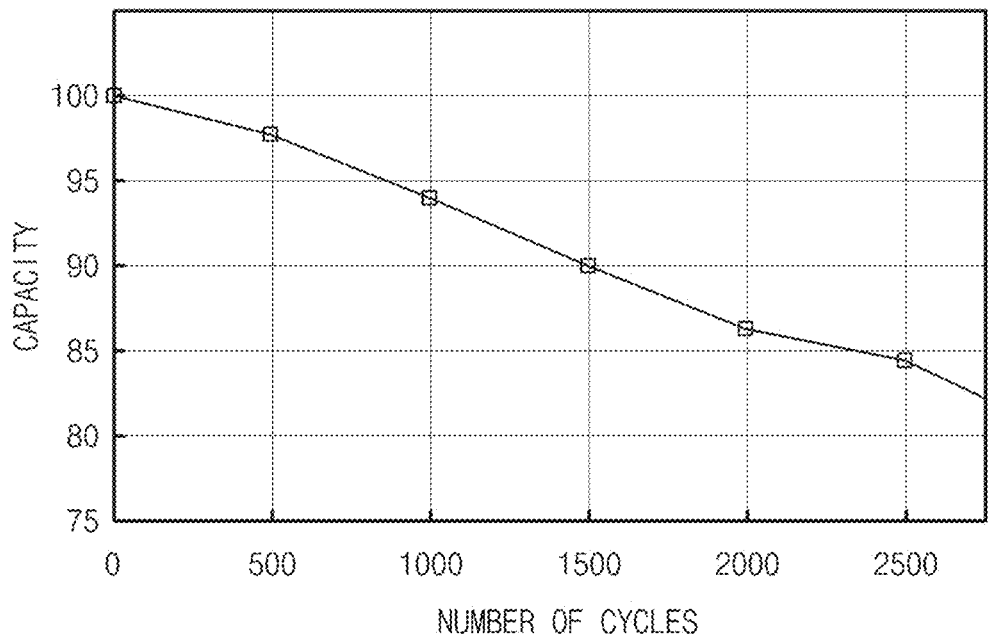
FIG. 1 is an exemplary graph illustrating a change in rated capacity of a battery based on a use of a battery according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present disclosure will be described in detail with reference to the accompanying drawings so that those skilled in the art may easily implement the spirit of the present disclosure.

A state of health (SOH) is a parameter quantitatively representing a change in characteristics of rated capacity of the battery due to an aging effect and may appreciate how much the rated capacity of the battery is degraded. Therefore, upon determining the state of health, it may be possible to replace a battery at an appropriate time and prevent the battery from being overcharged and overdischarged by adjusting charging and discharging capacity of the battery while the battery is being used. Therefore, the exemplary embodiment of the present disclosure discloses a technology of more accurately estimating the SOH.

Hereinafter, exemplary embodiments of the present disclosure will be described with reference to FIGS. 1 to 7.

A battery for a hybrid vehicle or an electric vehicle may be repeatedly charged and discharged while the vehicle is driven and may be configured to supply power to drive the vehicle. However, as a use period of the battery for the vehicle increases, chargeable capacity may decrease. Referring to FIG. 1, the chargeable capacity of the battery may gradually decrease each time the battery is used. In other words, it may be appreciated that when a cycle is 0, the chargeable capacity of the battery is 100, when the cycle becomes 500, the chargeable capacity of the battery is reduced to 97.5, when the cycle becomes 1000, the chargeable capacity of the battery is 93.7, and when the cycle becomes 2500, the chargeable capacity of the battery is reduced to 85. Accordingly, when the chargeable capacity of the battery is reduced, a driving distance may be reduced even though the battery is charged. Therefore, the system for estimating a state of health using battery model parameter according to the exemplary embodiment of the present disclosure may more accurately estimate the chargeable capacity of the battery, that is, the state of health (SOH).

Figure 2:
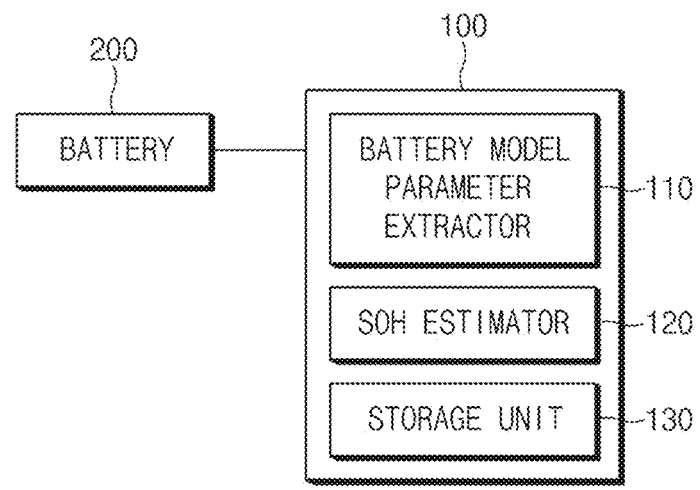
FIG. 2 is an exemplary configuration diagram of a system for estimating a state of health using battery model parameters according to an exemplary embodiment of the present disclosure.

FIG. 2 is an exemplary configuration diagram of a system for estimating a state of health using battery model parameters according to an exemplary embodiment of the present disclosure. Hereinafter, the state of health is referred to as an SOH. The system for estimating a state of health using battery model parameters according to an exemplary embodiment of the present disclosure may include a battery 200 and a battery management unit 100, in which the battery management unit 100 may include a battery model parameter extractor 110, an SOH estimator 120, and a storage unit 130. The battery 200 and battery management unit 100 with the components thereof may be operated by a controller.

The battery management unit 100 may be implemented as a battery management system (BMS) configured to manage an SOH, a state of charge (SOC), and the like of a vehicle battery. A configuration of a general battery management system in addition to the configuration for estimating an SOH which is a feature of the present disclosure will be omitted. The battery model parameter extractor 110 may be configured to extract the battery model parameters associated with capacity fade when the battery 200 begins to be charged (e.g., when charging begins). The battery model parameter associated with the capacity fade may include liquid electrolyte Li+diffusivity De, solid+electrode Li+diffusivity Dsp, solid−electrode Li+diffusivity Dsn, a +electrode reaction rate coefficient Kp, and a −electrode reaction rate coefficient Kn.

Figure 3A:
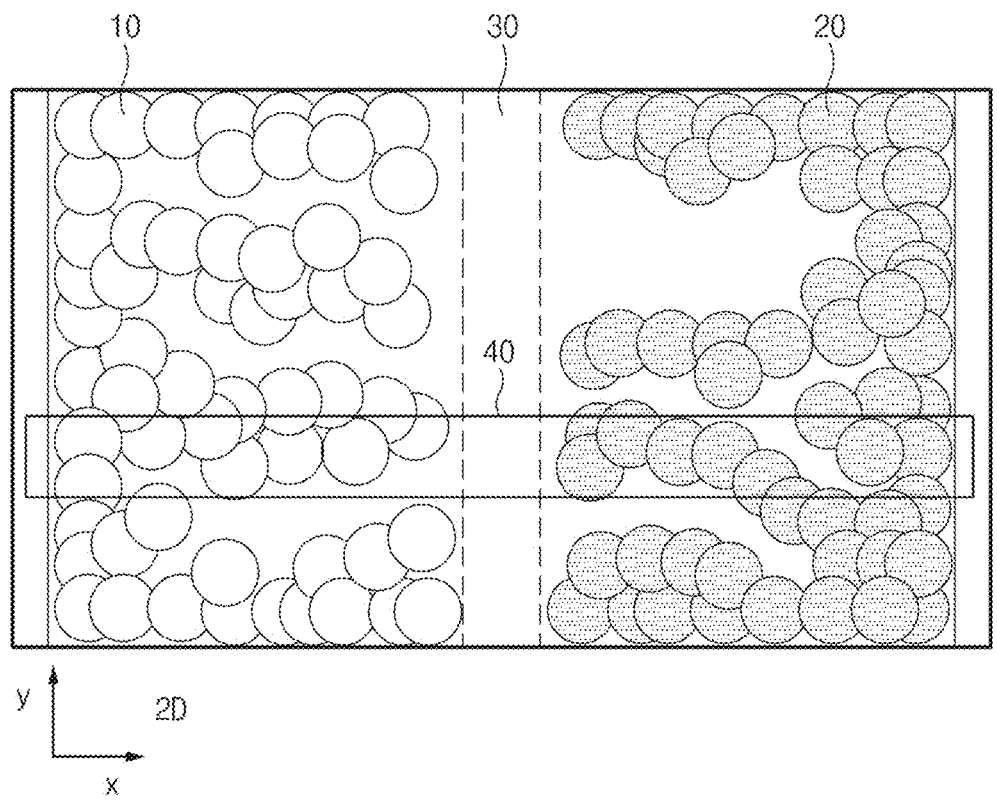
FIG. 3A is an exemplary internal structure diagram of a battery configured to include a positive electrode, a separator, and a negative electrode according to the exemplary embodiment of the present disclosure.
Figure 3B:
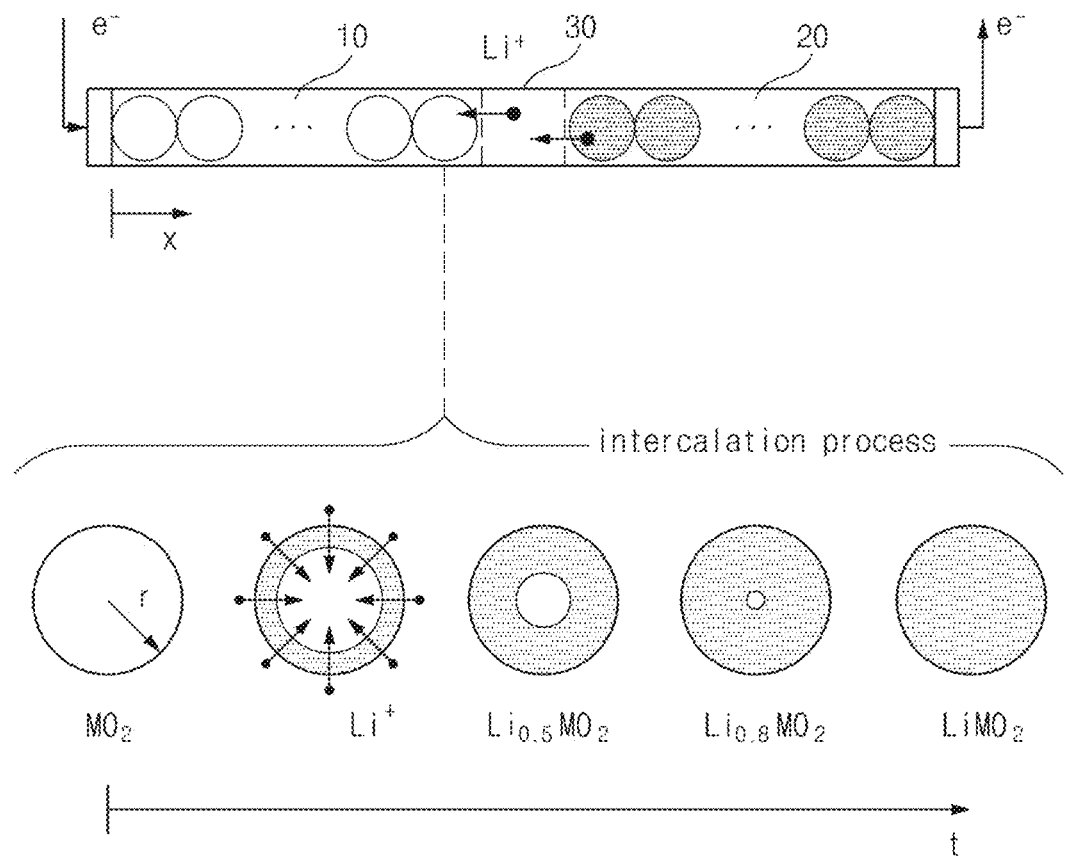
FIG. 3B is an exemplary diagram for describing a movement of lithium ions according to the exemplary embodiment of the present disclosure.
Figure 3C:
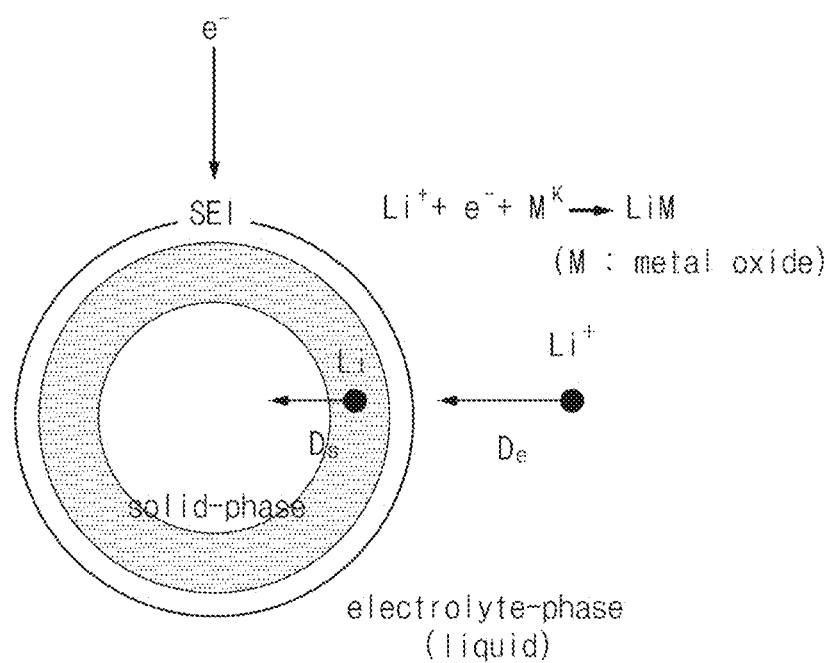
FIG. 3C is an exemplary diagram for describing battery model parameters according to the exemplary embodiment of the present disclosure.

The above parameters are associated with the deterioration of the battery. As illustrated in FIG. 3A, the battery may include a positive electrode 10, a negative electrode 20, and a separator 30 disposed between the positive electrode 10 and the negative electrode 20, in which an electrolyte 40 may flow in the separator 30. Referring to FIG. 3B, the lithium ion may be separated from the negative electrode 20 to flow in the positive electrode 10 through the separator 30, in which the solid−electrode Li+diffusivity Dsn parameter represents a liquid-phase diffusivity of Li-ion at the negative electrode 20, the solid+electrode Li+diffusivity Dsp parameter represents the liquid-phase diffusivity of Li-ion at the positive electrode 10, and the liquid electrolyte Li+diffusivity De parameter represents the liquid-phase diffusivity of Li-ion at the separator 30. Referring to FIG. 3C, a reaction formula and a reaction rate coefficient K based on the movement of the lithium ion are represented.

Figure 4:
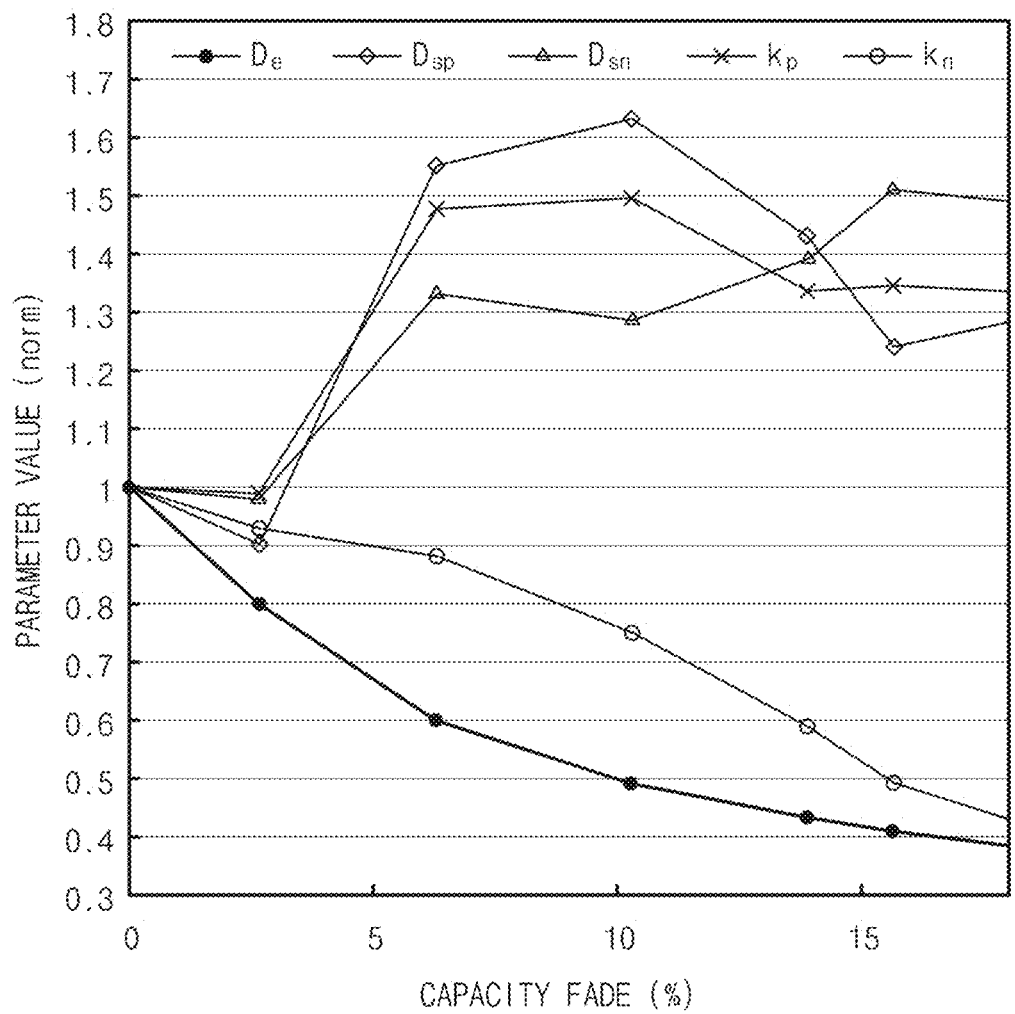
FIG. 4 is an exemplary graph illustrating a change in parameters based on capacity fades for each parameter according to the exemplary embodiment of the present disclosure.

However, FIG. 4 illustrates a change in parameter values for each capacity fade of the above five parameters De, Dsp, Dsn, Kp, and Kn, in which it may be appreciated that the solid+electrode Li+diffusivity Dsp, the solid−electrode Li+diffusivity Dsn, and the +electrode reaction rate coefficient Kp do not have a constant graph curve but are changed, while the liquid electrolyte Li+diffusivity De and the −electrode reaction rate coefficient Kn are constantly exponentially changed.

Figure 5:
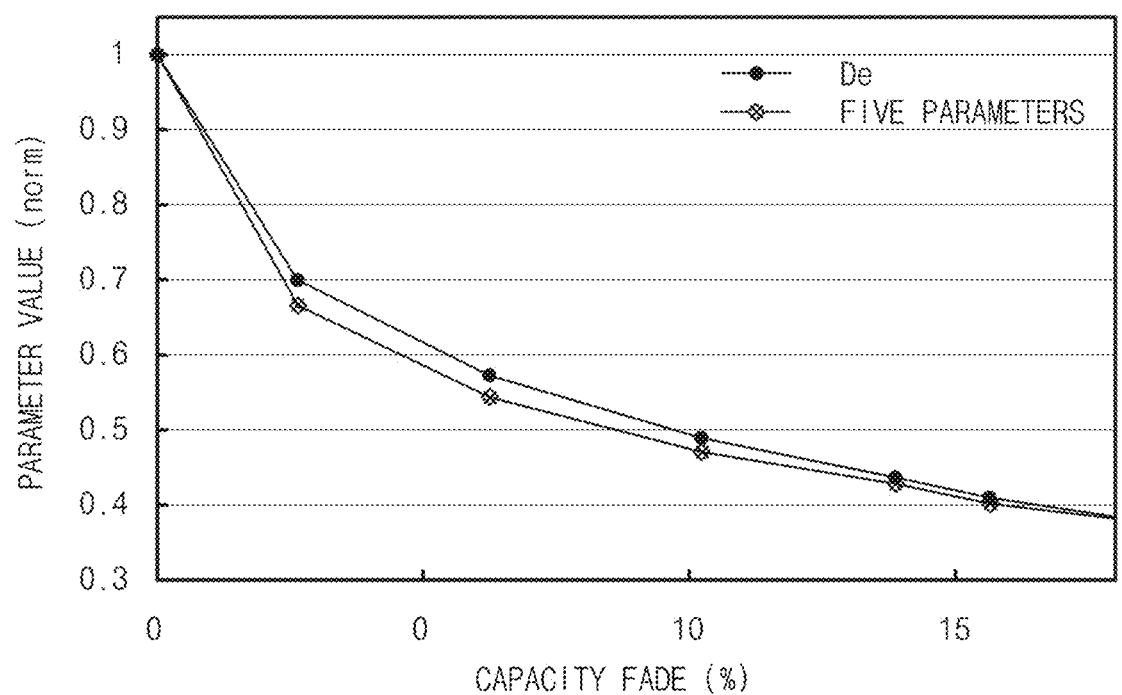
FIG. 5 is an exemplary graph for describing a reason of using a liquid-phase diffusivity of Li-ion parameter according to the exemplary embodiment of the present disclosure.
Figure 7:
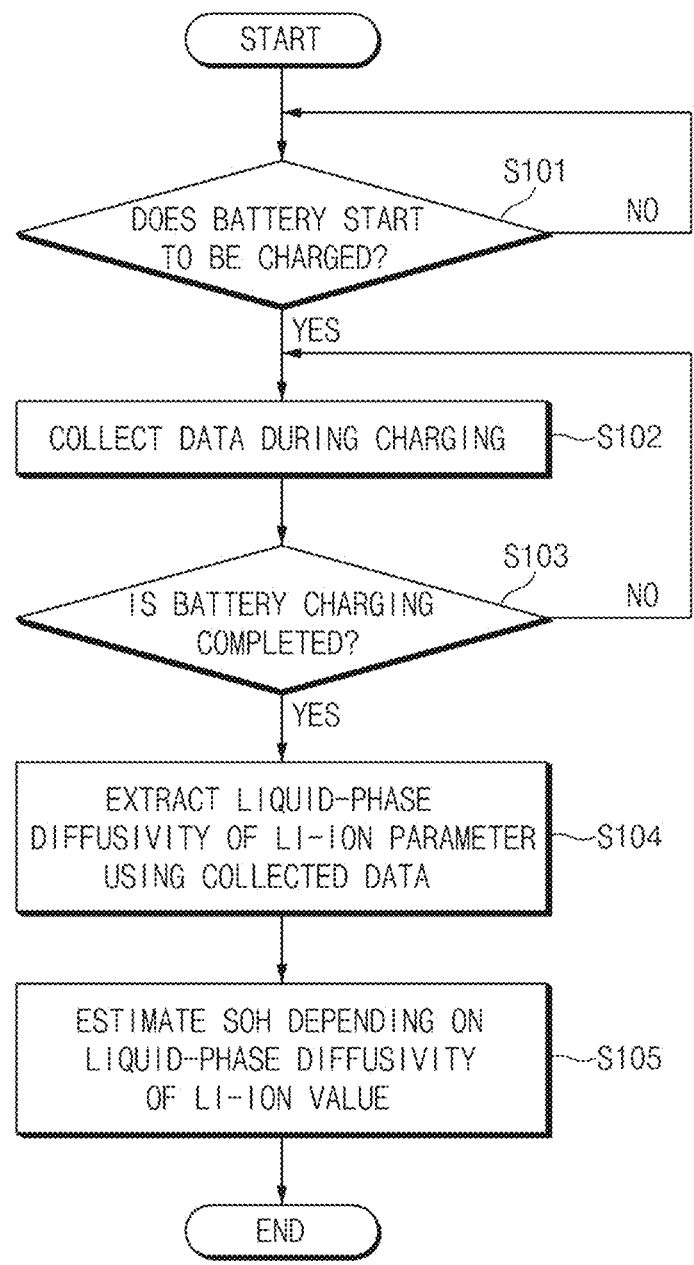
FIG. 7 is an exemplary flow chart of a method for estimating a state of health using battery model parameters according to an exemplary embodiment of the present disclosure.

However, referring to FIG. 5, a graph representing capacity fade for one liquid electrolyte Li+diffusivity De is similar to a graph representing capacity fade by a combination of the five parameters. Since the five parameters are combined, the algorithm is complex and a substantial amount of time is required, the exemplary embodiment of the present disclosure uses liquid electrolyte Li+diffusivity De, which is one parameter, to estimate the SOH.

In other words, when the battery deteriorates, phenomena such as agglomeration of solid electrode particle, formation of the solid-electrolyte interface layer, lithium metal deposition, mechanical cracking due to fatigue stress, and active material dissolution may occur. However, when the above phenomena occur, the liquid-phase diffusivity of Li-ion may be reduced and thus an electrochemical reaction rate may decrease. Since electrons flow through an external conducting wire, the flow of electrons is rapid and therefore resistance is not required to be considered and since the flow of most lithium ions is hindered within the battery, the liquid-phase diffusivity of Li-ion may be reduced.

Referring to a mapping table of FIG. 6, it may be appreciated that as the capacity fade of the battery increases, the liquid-phase diffusivity of Li-ion may decrease. The SOH estimator 120 may be configured to use the mapping table stored in the storage unit 130 to confirm the SOH mapped to the parameter values extracted from the battery model parameter extractor 110, to thus estimate the SOH. In particular, the SOH may indicate how much the deterioration or the reduction in rated capacity of the battery proceeds (e.g., an amount of deterioration).

The storage unit 130 may be configured to store a mapping table as illustrated in FIG. 6 in which the lithium ion speed, the rated capacity of the battery, the capacity fade, and the SOH are mapped. Particularly, the SOH may be calculated by the following Equation 1.

$$SOH(\%) = \frac{\text{Current Rated Capacity Of Battery}}{\text{Initial Rated Capacity Of Battery}} * 100 \qquad \text{Equation 1}$$

In FIG. 6, the capacity fade may refer to a quantity obtained by subtracting the SOH from 100. The SOH estimator 120 may be configured to measure the rated capacities of the battery for each liquid-phase diffusivity of Li-ion in advance based on an experiment value and calculate the capacity fade and the SOH to generate the mapping table as illustrated in FIG. 6 and store the generated mapping table in the storage unit 130. Hereinafter, a method for estimating a state of health using battery model parameters according to an exemplary embodiment of the present disclosure will be described in detail with reference to FIG. 7. First, it may be assumed that the mapping table as illustrated in FIG. 6 is stored in the storage unit 130.

The battery model parameter extractor 110 may be configured to determine whether the battery 200 begins to be charged (e.g., determine a start of battery charging) (S101) and collect data when the battery 100 begins to be charged (S102) which may include voltage data. Further, the battery model parameter extractor 110 may be configured to determine whether the charging ends (S103) and when the charging ends, the liquid-phase diffusivity of Li-ion parameters may be extracted using the collected data (S104). In particular, the extraction of the liquid-phase diffusivity of Li-ion parameters may refer to the calculation of the liquid-phase diffusivity of Li-ion in the liquid electrolyte and as the method for extracting parameters using data during the charging, a general method may be applied, and therefore the detailed description thereof will be omitted. Therefore, the SOH estimator 120 may be configured to extract the SOH that corresponds to the liquid-phase diffusivity of Li-ion calculated by referring to the mapping table stored in the storage unit 130 to estimate the SOH (S105).

The exemplary embodiment of the present disclosure may use the liquid-phase diffusivity of Li-ion parameters in the liquid electrolyte to more accurately extract the SOH to provide the more accurate SOH to the system for performing the state of charge calculation, and the like, using the SOH, to thus improve the reliability of various types of control devices using the SOH such as the state of charge, and the like.

According to the exemplary embodiments of the present disclosure, it may be possible to more accurately estimate the state of health (SOH) independent of the charging speed and the temperature. Further, according to the exemplary embodiments of the present disclosure, it may be possible to improve the reliability of the control technology in addition to the technology of securing the reliability of the battery model, calculating the state of charge (SOC) having a close relation with the state of health, and the like, by more accurately estimating the state of health.

The exemplary embodiments of the present disclosure described above have been provided for illustrative purposes. Therefore, those skilled in the art will appreciate that various modifications, alterations, substitutions, and additions are possible without departing from the scope and spirit of the present disclosure as disclosed in the accompanying claims and such modifications, alterations, substitutions, and additions fall within the scope of the present disclosure.

What is claimed is:

1. A method for estimating a state of health (SOH) using battery model parameters, comprising:
   determining, by a specifically programmed controller, whether a battery begins to be charged;
   collecting, by the specifically programmed controller, data for parameter extraction when the battery begins to be charged;
   extracting, by the specifically programmed controller, a liquid-phase diffusivity of lithium ion (Li-ion) parameter using the data when the charging of the battery ends; and
   estimating, by the specifically programmed controller, the state of health using the liquid-phase diffusivity of Li-ion parameter, using a mapping table including the SOH of a battery which are mapped to each liquid-phase diffusivity of Li-ion parameter value.

2. The method according to claim 1, further comprising:
   prior to the determining whether the battery begins to be charged, generating and storing, by the specifically programmed controller, the mapping table in which SOHs for each liquid-phase diffusivity of Li-ion parameter value are mapped by calculating the SOHs for each liquid-phase diffusivity of Li-ion parameter based on an experiment.

3. The method according to claim 2, wherein in the generating and storing of the mapping table, rated capacities of the battery for each liquid-phase diffusivity of Li-ion parameter are calculated and the SOH is calculated by dividing current rated capacity of the battery by initial rated capacity of the battery and stored.

4. The method according to claim 1, wherein the liquid-phase diffusivity of Li-ion parameter includes a liquid-phase diffusivity of Li-ion in a liquid electrolyte.

5. A non-transitory computer readable medium containing program instructions executed by a controller, the non-transitory computer readable medium specifically programmed to:
   determine whether a battery begins to be charged;
   collect data for parameter extraction when the battery begins to be charged;
   extract a liquid-phase diffusivity of lithium ion (Li-ion) parameter using the data when the charging of the battery ends; and
   estimate the state of health using the liquid-phase diffusivity of Li-ion parameter using a mapping table including the SOH of a battery which are mapped to each liquid-phase diffusivity of Li-ion parameter value.

6. The non-transitory computer readable medium of claim 5, wherein the non-transitory computer readable medium is further specifically programmed to:
   generate and store the mapping table in which SOHs for each liquid-phase diffusivity of Li-ion parameter value are mapped by calculating the SOHs for each liquid-phase diffusivity of Li-ion parameter based on an experiment, prior to the determining whether the battery begins to be charged.

7. The non-transitory computer readable medium of claim 6, wherein in the generating and storing of the mapping table, rated capacities of the battery for each liquid-phase diffusivity of Li-ion parameter are calculated and the SOH is calculated by dividing current rated capacity of the battery by initial rated capacity of the battery and stored.

8. The non-transitory computer readable medium of claim 5, wherein the liquid-phase diffusivity of Li-ion parameter includes a liquid-phase diffusivity of Li-ion in a liquid electrolyte.

* * * * *